United States Patent
Lai et al.

(10) Patent No.: US 7,977,244 B2
(45) Date of Patent: *Jul. 12, 2011

(54) SEMICONDUCTOR MANUFACTURING PROCESS

(75) Inventors: Yu-Tsung Lai, Tai-Chung Hsien (TW);
Chun-Jen Huang, Tainan Hsien (TW);
Jyh-Cherng Yau, Tai-Nan (TW);
Jiunn-Hsiung Liao, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 410 days.

This patent is subject to a terminal disclaimer.

(21) Appl. No.: 11/611,890

(22) Filed: Dec. 18, 2006

(65) Prior Publication Data
US 2008/0146036 A1    Jun. 19, 2008

(51) Int. Cl.
*H01L 21/302* (2006.01)

(52) U.S. Cl. ........ 438/700; 438/706; 438/710; 438/714; 438/720; 438/723; 438/735; 438/906; 438/963; 134/1.2; 216/46; 216/67

(58) Field of Classification Search .................. 438/700, 438/702, 706, 714, 719, 720, 723, 724, 725
See application file for complete search history.

(56) References Cited

U.S. PATENT DOCUMENTS

| | | | |
|---|---|---|---|
| 5,538,921 A * | 7/1996 | Obeng | 438/696 |
| 6,025,273 A | 2/2000 | Chen et al. | |
| 6,033,990 A * | 3/2000 | Kishimoto et al. | 438/710 |
| 6,107,192 A * | 8/2000 | Subrahmanyan et al. | 438/637 |
| 6,121,150 A * | 9/2000 | Avanzino et al. | 438/692 |
| 6,153,530 A | 11/2000 | Ye | |
| 6,380,096 B2 | 4/2002 | Hung | |
| 6,693,030 B1 * | 2/2004 | Subrahmanyan et al. | 438/637 |
| 7,094,705 B2 * | 8/2006 | Lin et al. | 438/710 |
| 7,557,043 B2 * | 7/2009 | Lin et al. | 438/700 |
| 2003/0008490 A1 * | 1/2003 | Xing et al. | 438/622 |
| 2003/0044725 A1 | 3/2003 | Hsue et al. | |
| 2004/0026040 A1 | 2/2004 | Kurihara | |
| 2004/0082164 A1 | 4/2004 | Chen et al. | |
| 2004/0178169 A1 | 9/2004 | Desphande | |
| 2004/0219797 A1 | 11/2004 | Honda | |
| 2004/0248404 A1 * | 12/2004 | Subrahmanyan et al. | 438/637 |
| 2005/0039854 A1 | 2/2005 | Matsuyama | |
| 2006/0154486 A1 | 7/2006 | Balasubramaniam | |
| 2006/0199370 A1 * | 9/2006 | Dai et al. | 438/624 |
| 2006/0286793 A1 * | 12/2006 | Lin et al. | 438/637 |
| 2007/0051471 A1 * | 3/2007 | Kawaguchi et al. | 156/345.36 |
| 2007/0184996 A1 * | 8/2007 | Weng et al. | 510/175 |
| 2007/0249165 A1 * | 10/2007 | Huang et al. | 438/638 |
| 2008/0050923 A1 * | 2/2008 | Kim et al. | 438/706 |

(Continued)

FOREIGN PATENT DOCUMENTS

CN    1468977 A    1/2004

(Continued)

*Primary Examiner* — Anita K Alanko
(74) *Attorney, Agent, or Firm* — Winston Hsu; Scott Margo (57) ABSTRACT

Disclosed is a semiconductor manufacturing process, in which a fluorine radical-containing plasma is used to etch a hard mask and a layer therebeneath; and a treatment is carried out using a gas reactive to fluorine radicals for reacting with residual fluorine radicals to form a fluorine-containing compound and remove it. Thus, precipitates formed by the reaction of fluorine radicals and titanium components existing in the hard mask to cause a process defect can be avoided.

12 Claims, 9 Drawing Sheets

Precipitate           Normal

U.S. PATENT DOCUMENTS

| | | | |
|---|---|---|---|
| 2008/0121619 A1* | 5/2008 | Lin et al. | 216/51 |
| 2008/0124917 A1* | 5/2008 | Oh et al. | 438/637 |
| 2008/0171433 A1* | 7/2008 | Huang et al. | 438/637 |
| 2009/0142931 A1* | 6/2009 | Wang et al. | 438/734 |
| 2009/0197404 A1* | 8/2009 | Yang | 438/652 |
| 2009/0246951 A1* | 10/2009 | Feustel et al. | 438/637 |

FOREIGN PATENT DOCUMENTS

| | | |
|---|---|---|
| CN | 1738021 A | 2/2006 |
| TW | 589926 | 6/2004 |
| TW | I233644 | 6/2005 |
| TW | 200636857 | 10/2006 |
| TW | I263276 | 10/2006 |

* cited by examiner

Normal

Precipitate

Fig. 9

SEMICONDUCTOR MANUFACTURING PROCESS

BACKGROUND OF THE INVENTION

1. Field of the Invention

The invention relates to a semiconductor manufacturing process, and more particularly, to a process using a hard mask comprising metal during a semiconductor process.

2. Description of the Prior Art

With the progress of the semiconductor industry, the devices of integrated circuits have been reduced in size under sub-micron for development and design of high-density integrated circuits. In semiconductor manufacturing processes, mask technology is frequently utilized.

For example, integrated circuit fabrication on semiconductor structures for ultra scale integration (ULSI) requires multiple levels of metal interconnections for electrically connecting the miniaturized semiconductor devices. To overcome difficulties in fabricating metal interconnection in multi-layer, the damascene structure has been extensively researched and developed. In addition, because the resistive coefficient of copper is lower than that of other metals, such as aluminum, and copper has the advantage of better electro-migration resistance while low-k material effectively reduces resistance-capacitance (RC) delay effects between metal interconnections, single copper damascene structure and copper damascene structure have been widely used in fabrication of integrated circuits. Accordingly, the copper damascene process is taken as the technique that can solve metal interconnection problem of deep sub-half micro integrated circuits in the future.

Figure 1:
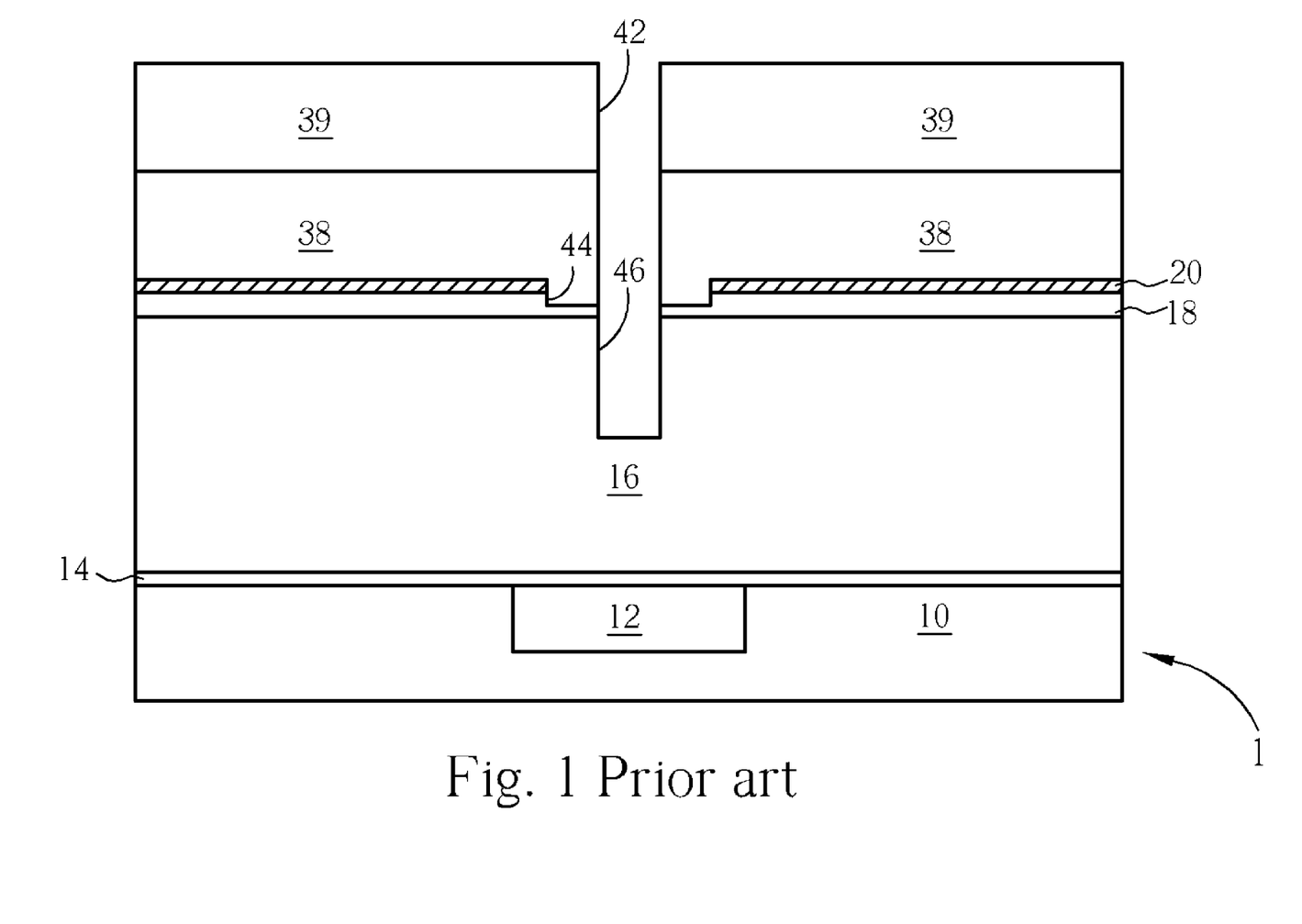
FIGS. 1 and 2 are schematic, cross-sectional diagrams showing a conventional partial-via-first dual damascene process.
Figure 2:
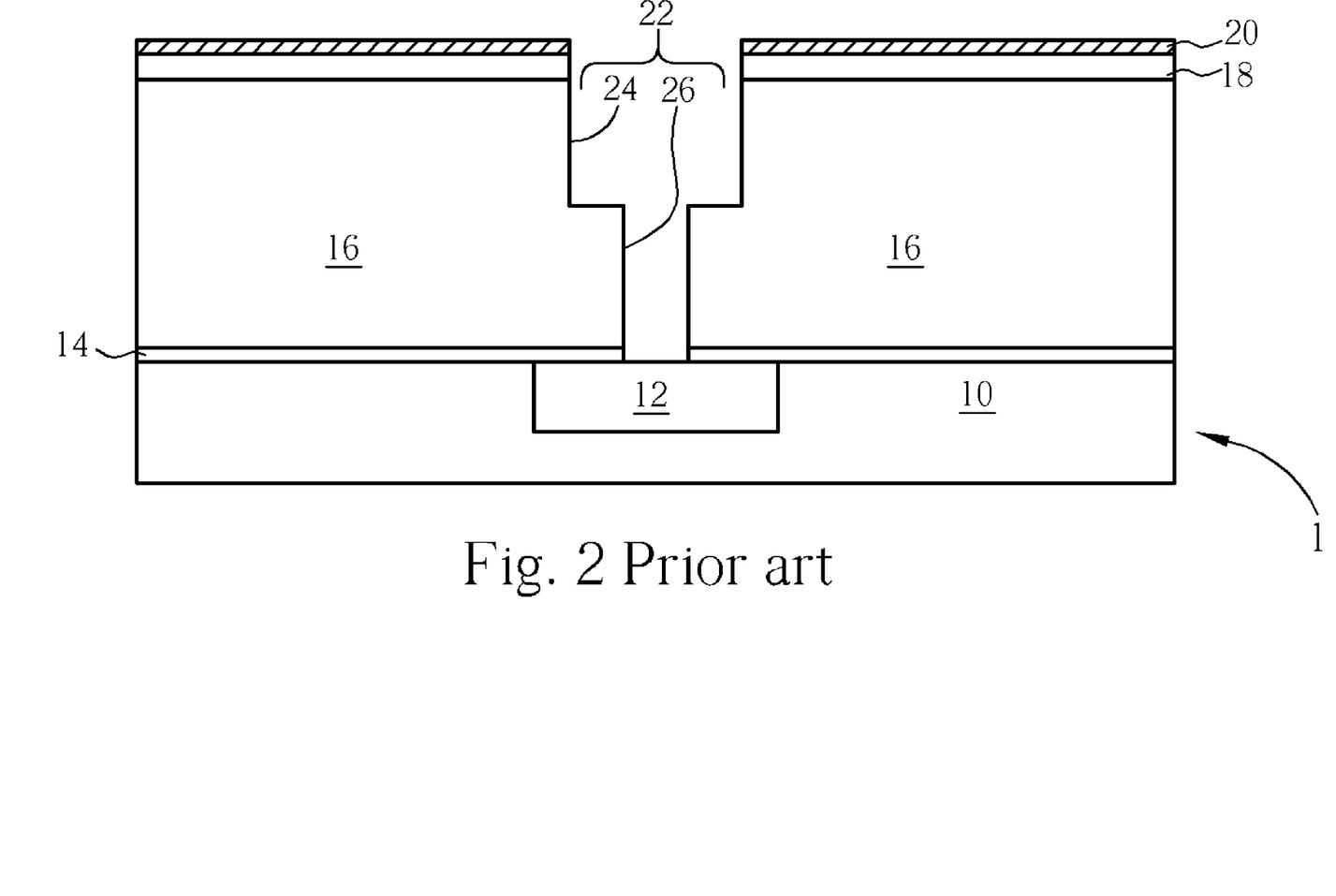

In the damascene interconnect structure, a dielectric layer is defined to an electric circuit pattern by etching and copper is filled into recesses of the pattern. FIGS. 1 and 2 are schematic, cross-sectional diagrams showing a conventional partial-via-first dual damascene process. As shown in FIG. 1, a substrate 1 having thereon a base layer or a lower low-k dielectric layer 10 is provided. A lower copper wiring 12 is inlaid into the lower low-k dielectric layer 10. The lower copper wiring 12 and the low-k dielectric layer 10 are covered with a lower cap layer 14, usually made of nitrogen-doped silicon carbide (SiCN). A low-k dielectric layer 16, a silicon oxide cap layer 18, a hard mask layer 20, and a bottom anti-reflective coating (BARC) layer are sequentially deposited on the lower cap layer 14. A layer of photoresist (not shown) having a trench opening therein is formed on the BARC layer for defining the trench pattern of the damascene conductive line. Subsequently, a dry etching process is carried out. A trench recess 44 is etched into the hard mask layer 20 and the silicon oxide cap layer 18 through the trench opening. The dry etching stops on the silicon oxide cap layer 18. The remaining photoresist and BARC layer are then stripped off to expose the remaining hard mask 20. Thereafter, another BARC layer 38 is coated over the substrate 1 and fills the trench recess 44. A layer of photoresist 39 is then formed on the BARC layer 38. The photoresist layer has a via opening 42 patterned by using conventional lithographic methods. The via opening 42 is situated directly above the trench recess 44. Thereafter, using the photoresist layer 39 as an etching hard mask, the BARC layer 38, the silicon oxide cap layer 18, and the low-k dielectric layer 16 are etched through the via opening 42, thereby forming a partial via 46 in an upper portion of the dielectric layer 16.

Subsequently, as shown in FIG. 2, the remaining photoresist layer 39 and the BARC layer 38 are stripped off by using oxygen plasma, thereby exposing the remaining hard mask layer 20. Using the hard mask layer 20 as an etching hard mask, a dry etching is performed to etch away the exposed silicon oxide cap layer 18 and the low-k dielectric layer 16, simultaneously through the partial via 46 and continuously to etch the low-k dielectric layer 16, to convert the pattern of trench recess 44 and partial via 46 to the low-k dielectric layer 16, thereby forming a dual damascene opening 22 comprising a trench opening 24 and a via opening 26. This dry etching stops on the lower cap layer 14. Thereafter, a so-called liner removal step or LRM step is carried out to remove the exposed lower cap layer 14 from the via opening 26, thereby exposing the lower copper wiring 12. The subsequent steps for forming an upper damascene wiring structure including, for example, deposition of barrier and plating of copper are known in the art and are therefore omitted. The aforesaid etching step to remove cap layer 14 usually uses a plasma source comprising hydrogen-containing carbon fluoride such as $CH_2F_2$ or $CHF_3$.

However, using a fluoroalkane plasma, such as $CH_2F_2$ or $CHF_3$ plasma, to remove the cap layer 14 in the aforesaid etching step may lead to a process defect due to the formation of titanium-fluorine compound precipitates on the substrate surface through the reaction of fluorine radicals with the titanium contained in the hard mask. It is not desired and is a problem needed to solve.

Therefore, there is till a need for a better semiconductor manufacturing method to solve the problem that precipitates form on the substrate when a hard mask comprising titanium is used and fluorine radicals are remained.

SUMMARY OF THE INVENTION

It is a main object of the present invention to provide a semiconductor manufacturing process, which is capable of avoiding formation of precipitates on a substrate surface to lead a process defect in an etching process employing a hard mask.

The semiconductor manufacturing process according to the present invention comprises the steps as follows. A substrate comprising a hard mask and an underlying layer beneath the hard mask is provided. The hard mask and the underlying layer are etched with a fluorine radical-containing plasma. The substrate is treated with a gas reactive to fluorine radicals, and thereby a fluorine-containing compound is formed through a reaction of the gas with residual fluorine radicals remained on the surface or ambient atmosphere of the substrate and the fluorine-containing compounds is removed.

In the semiconductor manufacturing process according to the present invention, after etching the underlying layer beneath the hard mask with fluorine radical-containing plasma using a hard mask, such as Ti/TiN hard mask, a treatment (or post-treatment) is carried out using a gas reactive to fluorine radicals to react with residual fluorine radicals. A fluorine-containing compound is thus formed and removed. Thus, the process defect caused by the titanium-fluorine compound precipitates formed on the substrate surface through the reaction of fluorine radicals with, for example, titanium, contained in the hard mask as that in the prior art can be prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
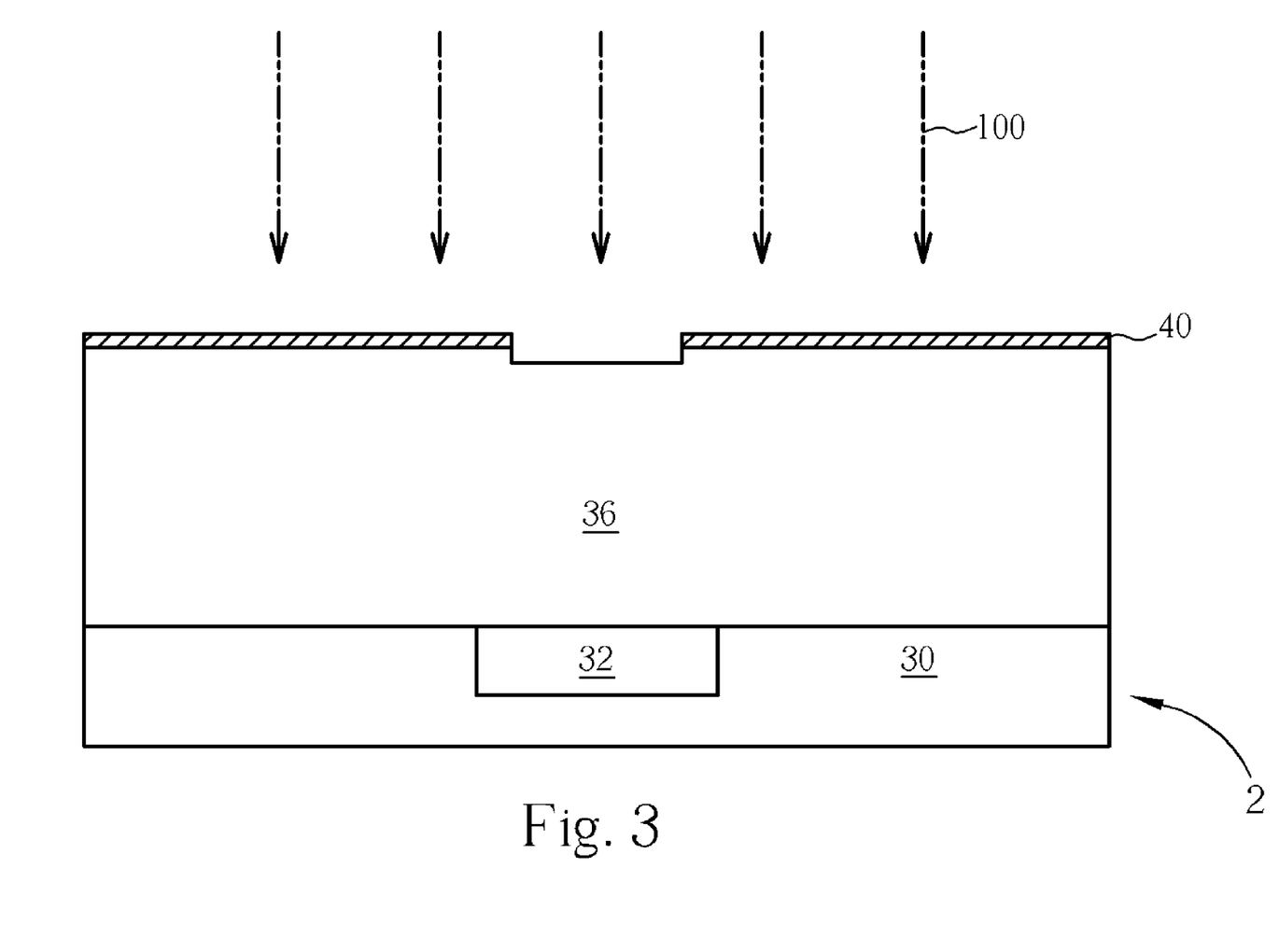
FIGS. 3 and 4 are schematic, cross-sectional diagrams showing an embodiment of a damascene process using the process according to the present invention.
Figure 4:
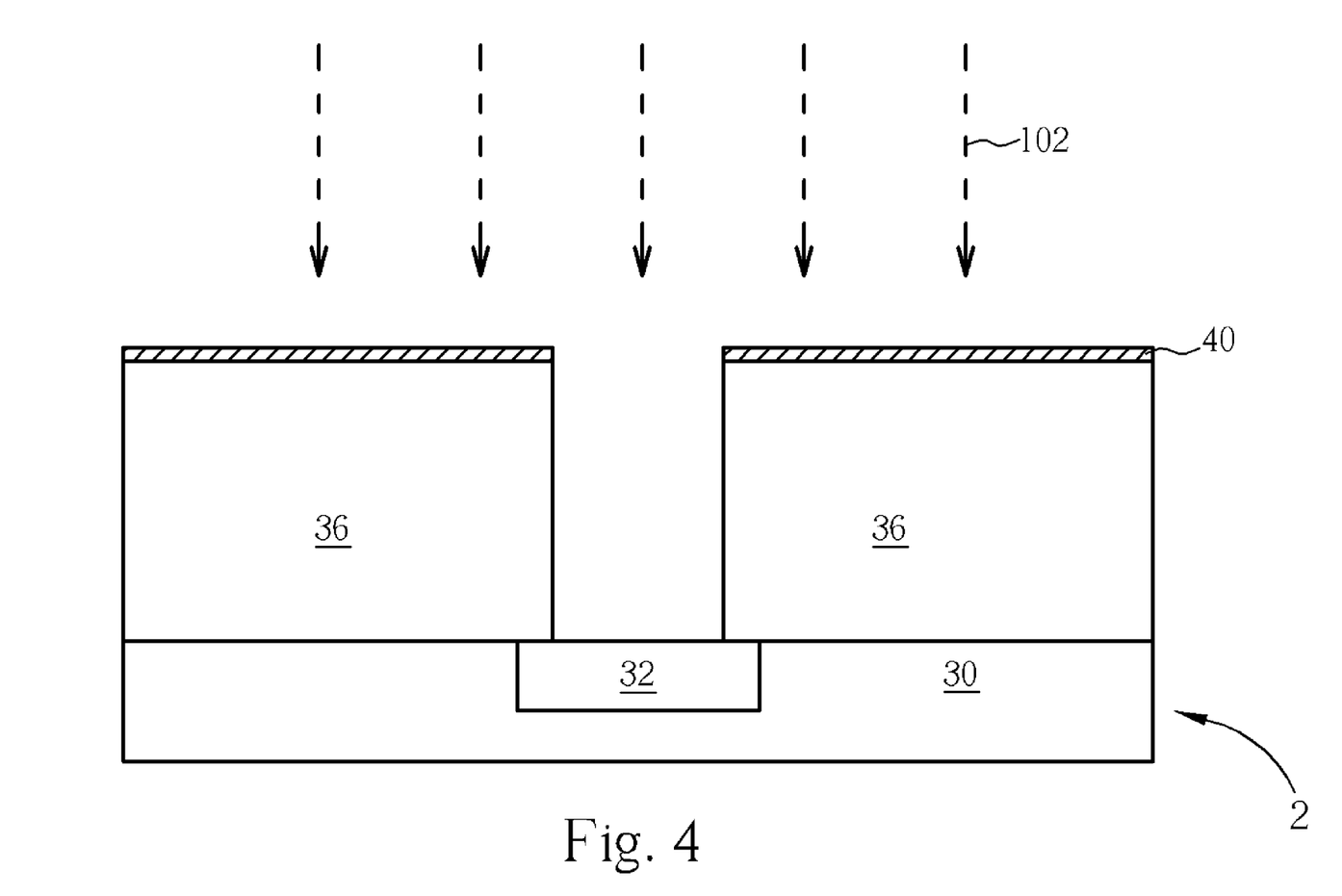

Please refer to FIGS. 3 and 4, schematic, cross-sectional diagrams showing an embodiment of the semiconductor manufacturing process according to the present invention. The embodiment is illustrated with a damascene process. In the drawings, like numeral numbers designate like elements, regions or layers. It is understood that the present invention is not limited to the embodiments illustrated in the drawings. The process of the present invention may be suited in any process as long as a hard mask, especially a hard mask containing titanium component, such as Ti metal or TiN, and fluorine radical containing gas for etching are used in the process. The process may be, for example, a damascene process or a dual damascene process, but not limited thereto. The damascene process may be a trench-first damascene, a via-first damascene, or a partial via-first damascene processes, among others.

As shown in FIG. 3, a substrate 2, which may be a semiconductor substrate, having thereon a base layer or a dielectric layer 30 is provided. A conductive layer 32, such as a copper wiring is inlaid into the dielectric layer 30. Next, a dielectric layer 36 and a hard mask layer 40 are formed on the dielectric layer 30 and the conductive layer 32. The hard mask layer 40 may comprise TiN, Ti metal, or other material containing Ti as its component. The thickness of the hard mask layer 40 may be between about 250 and 450 angstroms, and preferably between about 300 and 350 angstroms. According to the preferred embodiment, the dielectric layers 30 and 36 may include organosilicate glass (OSG), which is a silicon oxide that is doped with carbon and hydrogen atoms and has a dielectric constant (k) value between 2 and 3.

Subsequently, a layer of photoresist (not shown) having a trench opening therein is formed on the hard mask layer 40 to define a trench pattern of the damascene wiring. Next, an etching process is performed to etch the hard mask layer 40 through the trench opening, thereby forming a trench recess. Next, the remained photoresist layer is stripped by, for example, oxygen plasma or the like.

Thereafter, a dry etching process 100 is carried out using the hard mask layer 40 as a hard mask for etching, to etch downward through the dielectric layer 36 at the part not covered with the hard mask layer 40, until the conductive layer 32 is exposed. The etching process for removing the dielectric layer 36 uses a mixed gas plasma containing fluorine, such as a mixed gas plasma composed of fluorocarbon compound, inert gas, and nitrogen gas.

Thereafter, as shown in FIG. 4, a treatment 102 to remove fluorine radicals is carried out using a gas plasma capable of bonding to the fluorine radicals and then being removed, that is, a gas plasma is introduced to the surface or ambient atmosphere of the substrate to react with residual fluorine radicals to form a product which may be a fluorocarbon compound or polymer and is removed away from the substrate surface or the ambient atmosphere by washing or a vacuum of the process apparatus. In other words, a gas plasma is utilized for bonding with fluorine radicals to remove residual fluorine radicals, such that precipitates of titanium-fluoride compound or polymer (such as $Ti_xF_y$) on the substrate to cause process defects can be avoided. The wafer after subjecting to the treatment of fluorine radical removal has an increased Q time, for example, 18 hours, without formation of undesirable particles. The treatment of fluorine radical removal can be carried out in the same chamber in which the dry etching is performed, that is, in situ, or in another chamber in a same tool or in another tool. It is not particularly limited, but "in situ" is more convenient. The gas flow and the reaction time are not particularly limited, and preferably the residual fluorine radicals can completely reacted. There is not a particular limitation on the gas plasma useful in the present invention as long as the gas plasma can bond to fluorine radicals and be removed. For example, carbon monoxide (CO), carbon dioxide ($CO_2$), hydrocarbon compound, hydrogen cyanide (HCN), and the like are useful. After the treatment with a gas reactive to fluorine radicals, the substrate may be purged with an inert gas to remove residual gas reactive to fluorine radicals.

Subsequently, steps for forming an upper damascene wiring structure including, for example, deposition of barrier, plating of copper, chemical mechanical polishing (CMP), and the like may be performed to form a damascene wiring structure.

Figure 5:
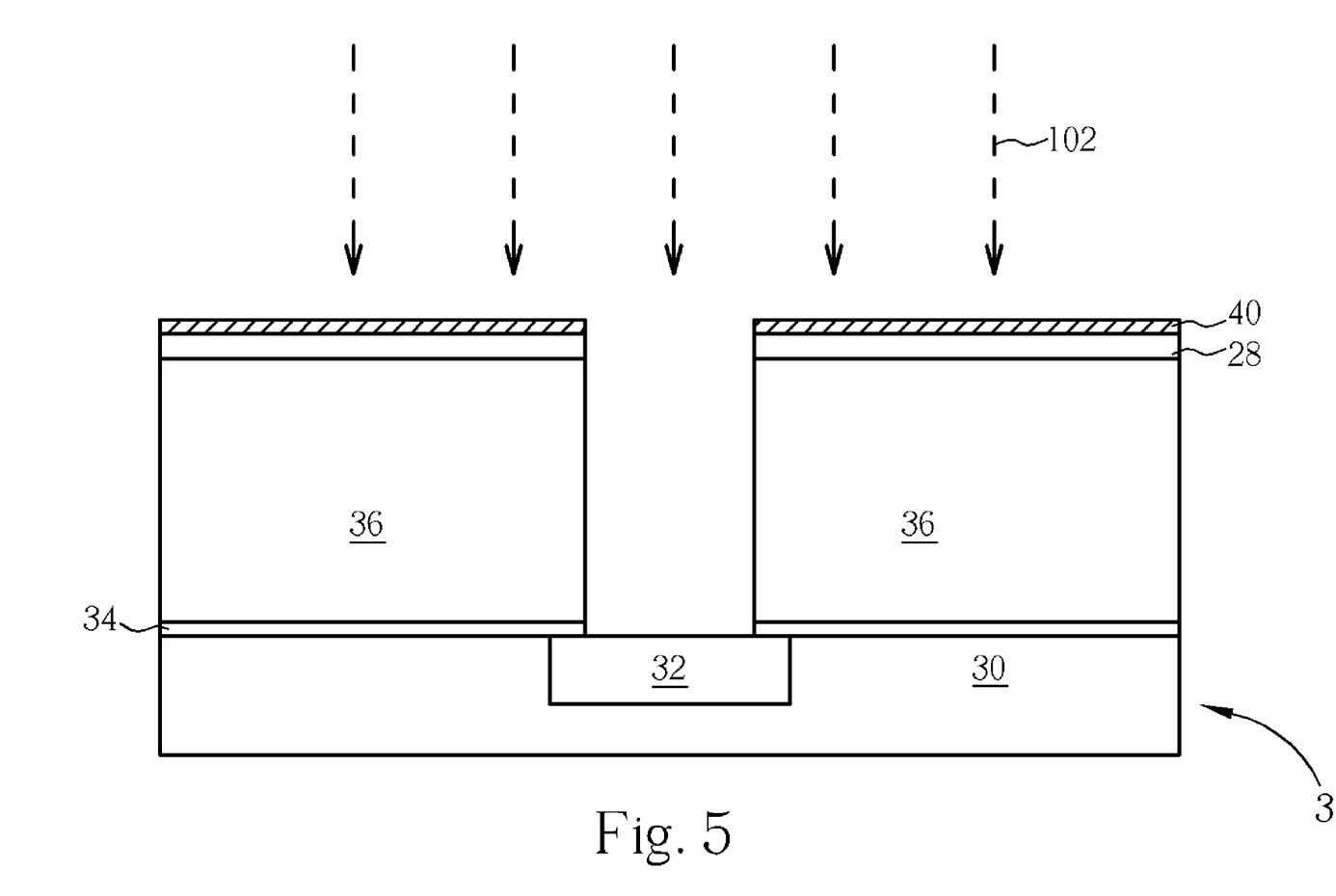
FIG. 5 is a schematic, cross-sectional diagram showing another embodiment of a damascene process using the process according to the present invention.

Please refer to FIG. 5, a schematic, cross-sectional diagram showing another embodiment of a damascene process using the process according to the present invention. The substrate 3 may further comprise a cap layer 34 covering on the dielectric layer 30 and the conductive layer 32, and there is a cap layer 28 beneath the hard mask layer 40 and on the dielectric layer 36.

Figure 6:
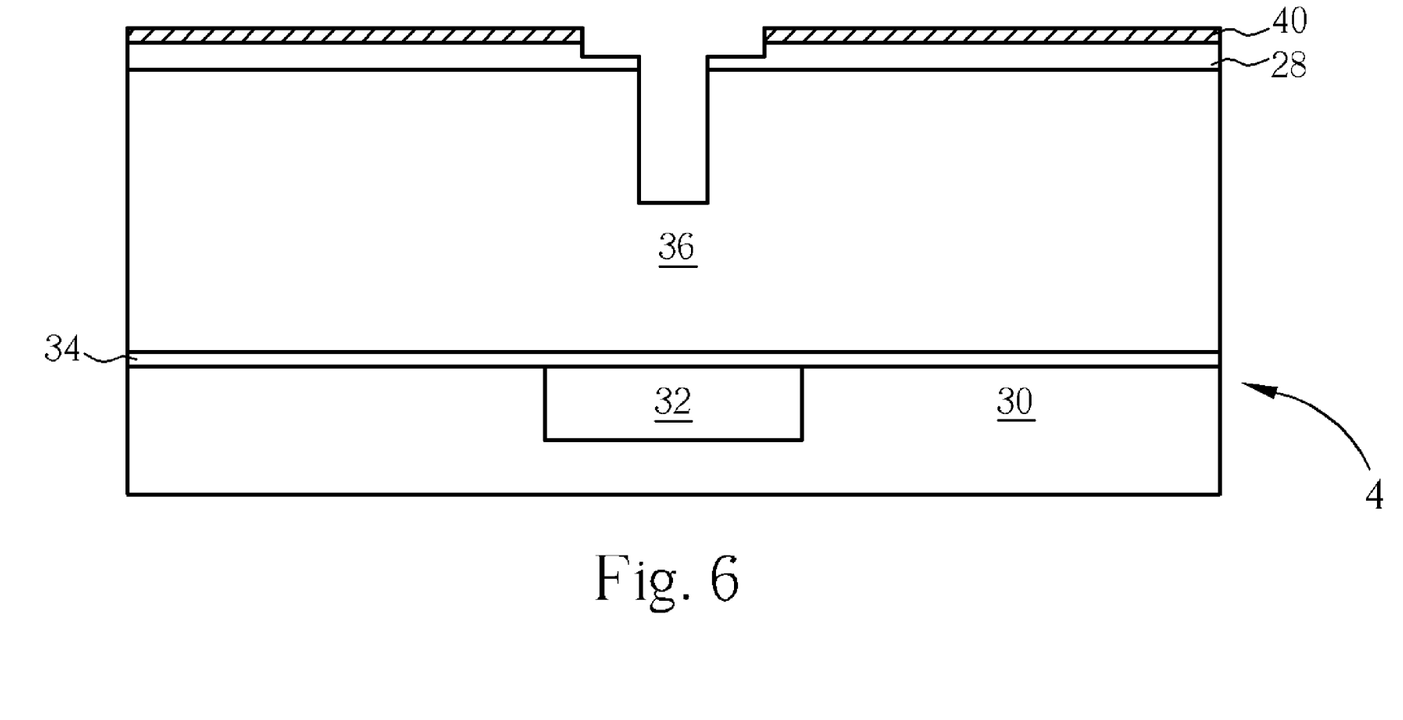
FIGS. 6 and 7 are schematic, cross-sectional diagrams showing further another embodiment of a damascene process using the process according to the present invention.
Figure 7:
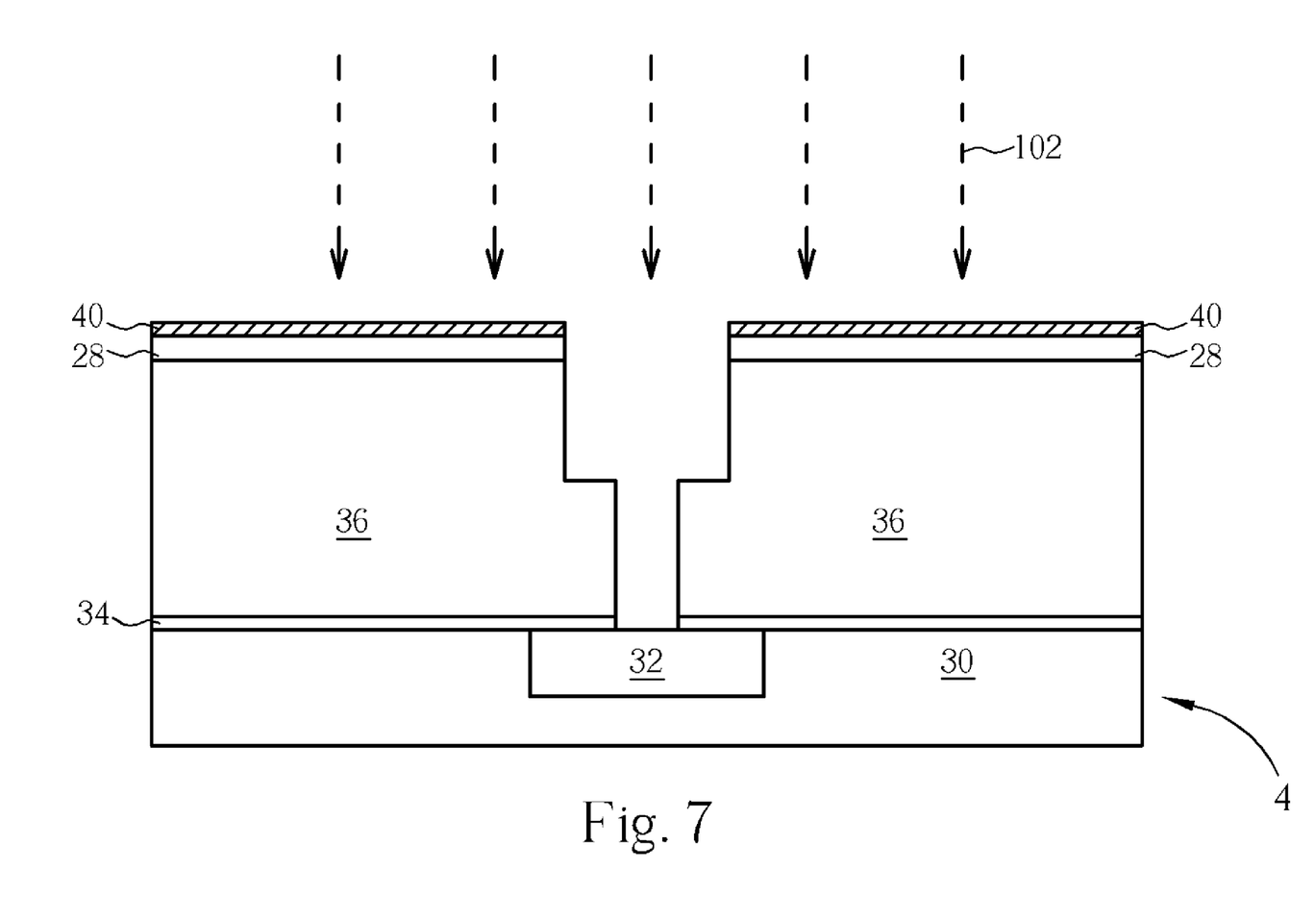

Please refer to FIGS. 6 and 7, schematic, cross-sectional diagrams showing further another embodiment of a damascene process using the process according to the present invention. In the drawings, like numeral numbers designate like elements, regions or layers. A damascene process is still used in the embodiment for illustrative purpose, with a main feature that a treatment after etching is carried out to remove fluorine radicals.

First, a substrate 4 having thereon a base layer or a dielectric layer 30 is provided. A conductive layer 32, such as copper wiring, is inlaid into the dielectric layer 30. The conductive layer 32 and the dielectric layer 30 are covered with a cap layer 34. The cap layer 34 may be made, for example, of nitrogen-doped silicon carbide (SiCN) and has a thickness of about 300-800 angstroms, preferably about 500 angstroms. The cap layer 34 may be made of other materials, such as, silicon nitride (SiN), silicon oxy-nitride (SiON), silicon carbide (SiC), oxygen-doped silicon carbide (SiCO), or the like.

Subsequently, a dielectric layer 36, a cap layer 28, and a hard mask layer 40 are sequentially formed on the cap layer 34, and a BARC layer may be further formed (not shown). The hard mask layer 40, the dielectric layers 30 and 36 are as described above.

The cap layer 28 may comprise TEOS-based silicon oxide and may be deposited by a plasma-enhanced chemical vapor deposition (PECVD) method using a relatively low content of carbon, wherein tetraethylorthosilicate (TEOS) precursor, oxygen ($O_2$) and a relatively high $O_2$/TEOS ratio are employed.

Subsequently, a layer of photoresist (not shown) having a trench opening therein is formed on the hard mask layer 40 or the BARC layer. The trench opening defines the damascened wiring trench pattern to be etched into the underlying dielectric layer 36. Subsequently, a dry etching process is carried out. A trench recess is formed by etching into the hard mask layer 40 and the cap layer 28 through the trench opening. The dry etching stops in the cap layer 28. The remained photoresist and BARC layer are then stripped off, for example, with oxygen-containing plasma, to expose the remained hard mask layer 40.

Thereafter, as described above, another BARC layer (not shown) may be further deposited on the substrate 4 to fill the trench recess and covering the hard mask layer 40. A layer of photoresist is then formed on the BARC layer. The photoresist layer has a via opening patterned by conventional lithographic methods. The via opening is situated directly above the trench recess. Subsequently, using the photoresist layer as an etching hard mask, the BARC layer, the cap layer 28, and the dielectric layer 36 are etched through the via opening, thereby forming a partial via feature in an upper portion of the dielectric layer 36.

Subsequently, the remained photoresist layer and the BARC layer are stripped off using oxygen plasma, and the hard mask layer 40 having a trench recess pattern is exposed, as shown in FIG. 6.

Thereafter, a dry etching is performed using the hard mask layer 40 as an etching hard mask, to etch away the exposed cap layer 28 and the dielectric layer 36 through the partial via, thereby forming a dual damascene opening comprising a trench opening and a via opening that exposes a portion of the cap layer 34.

Subsequently, the LRM step is carried out to remove the exposed cap layer 14 from the via opening, thereby exposing a portion of the conductive layer 32. A mixed gas plasma containing fluorocarbon compound, such as carbon tetrafluoride/nitrogen monoxide, carbon tetrafluoride/nitrogen dioxide, carbon tetrafluoride/nitrogen gas, or a hydrogen-containing fluorocarbon compound gas plasma, such as $CH_2F_2$ or $CHF_3$ plasma is preferably utilized to remove the cap layer 34 by etching.

Thereafter, as shown in FIG. 7, a treatment 102 to remove fluorine radicals is carried out, that is, a plasma, such as CO plasma, is introduced to the surface or ambient atmosphere of the substrate to react with residual fluorine radicals to form a product which may be a fluorocarbon compound or polymer and is removed away from the substrate surface by a vacuum of the process apparatus. This treatment can avoid process defects caused by the precipitates of titanium-fluorine compound or polymer on the substrate.

Subsequently, steps for forming an upper damascene wiring structure including, for example, deposition of barrier, plating of copper, CMP, and the like may be performed to form a damascene wiring structure.

In case that a CO plasma is used in the treatment for removing fluorine radicals, after the treatment, a gas or plasma combinable with CO or an inert carrier gas unharmful to materials on the substrate can be further used to perform a treatment to remove residual CO. When CO remains on the surface of the substrate, CO tends to react with copper to produce $CuCO_3$, which is not desired. Therefore, it is preferably to remove residual CO. The removal may be conveniently carried out in situ, but not limited thereto, for example, may be performed in another tool or chamber. The gas flow rate and reaction time for removing residual CO are not particularly limited, and preferably that the residual CO can be completely reacted or be purged or carried away. There is not a particular limitation on the gas or plasma used to remove residual CO, as long as the removal of CO as aforesaid can be accomplished and unharmful or inert to the substrate. For example, hydrogen gas ($H_2$), ammonia gas ($NH_3$) or the like is useful.

Figure 8:
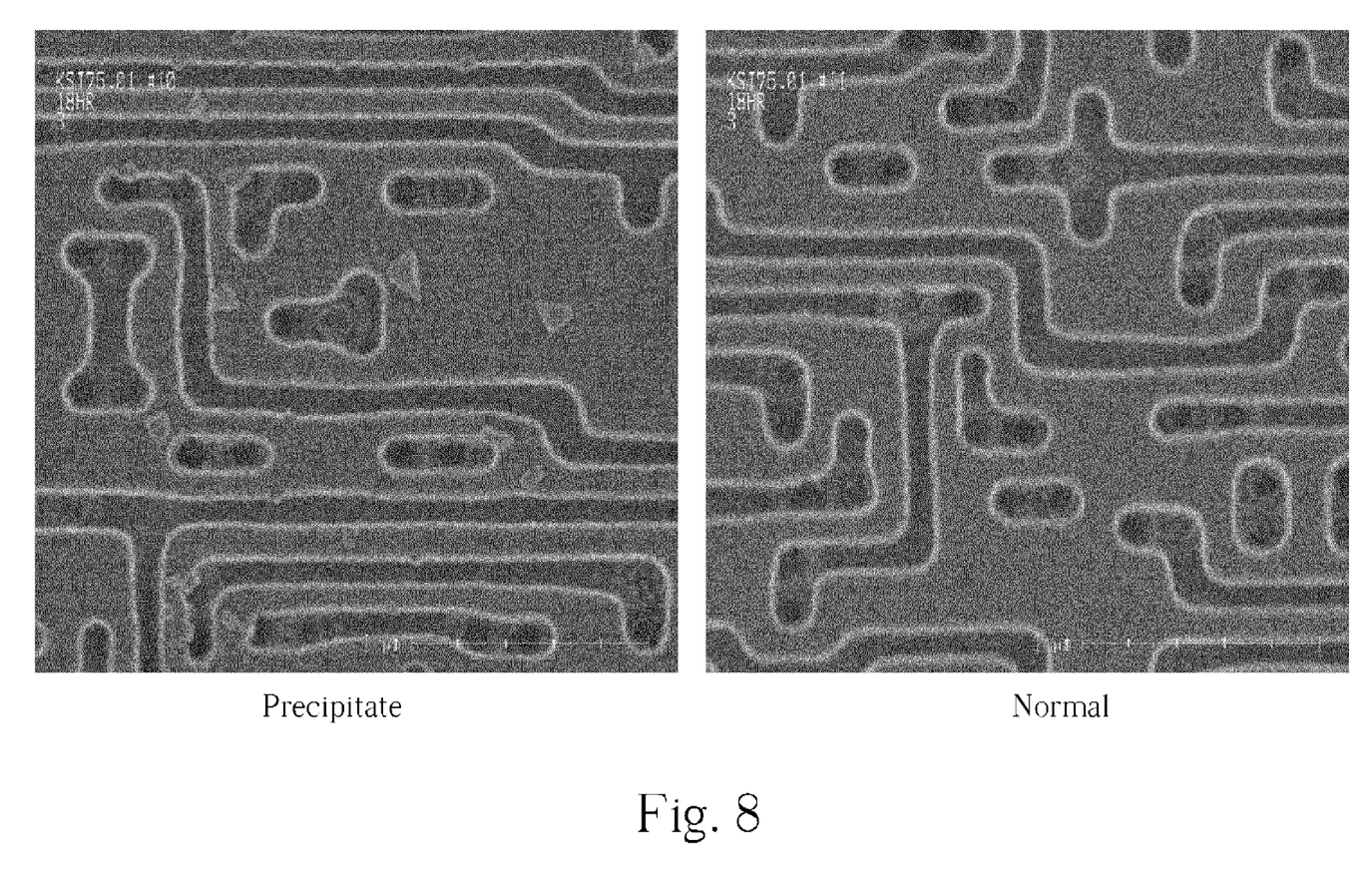
FIG. 8 shows SEM images of the results of a conventional damascene process and an embodiment of a damascene process using the process according to the present invention.
Figure 9:
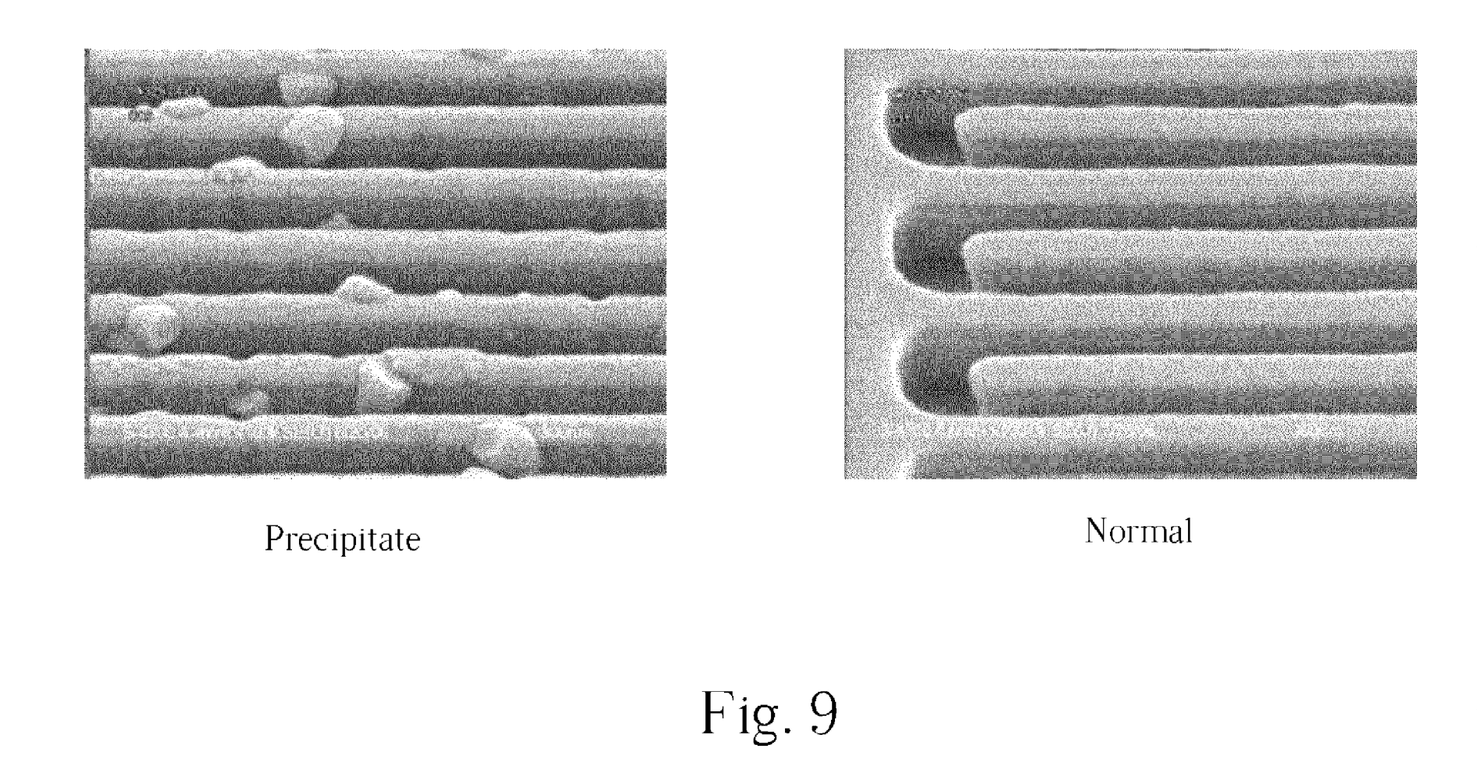
FIG. 9 shows tilt SEM images of the results of a conventional damascene process and an embodiment of a damascene process using the process according to the present invention.

FIG. 8 shows SEM images of the results of a comparative example using a conventional damascene process idled for 18 hours after the LRM step and an embodiment of a damascene process using the process according to the present invention idled for 18 hours after the treatment for removing fluorine radicals after the LRM step. FIG. 9 shows tilt SEM images thereof.

In the comparative example, an etching step was carried out for 42 seconds under a pressure of 40 mTorr, using 5 sccm of $C_4F_8$, 112 sccm of $CF_4$, 150 sccm of Ar, and 6 sccm of $O_2$. The upper power is 1200 watts, the lower power is 250 watts, and the center/edge flow ratio is 50:50. Next, an LMR step was carried out for 47 seconds under a pressure of 50 mTorr, using 400 sccm of $CF_4$, 600 watts of upper power, 250 watts of lower power, and a center/edge flow ratio of 90:10. Thereafter, a first treatment was carried out for 10 seconds under a pressure of 60 mTorr, using 260 sccm of $N_2$, 400 watts of upper power, and a center/edge flow ratio of 50:50. Subsequently, a second treatment was carried out for 10 seconds under a pressure of 60 mTorr, using 260 sccm of $N_2$, no power for the upper and lower plates, and a center/edge flow ratio of 50:50. There are precipitates occurring on the surface of the resulting substrate. As the left SEM photographs shown in FIGS. 8 and 9, a number of particles are clearly shown on the substrate 18 hours after the substrate is etched. A number of defects were also found through the scanning of the surface of the substrate by a KLA defect-scanning tool.

In the embodiment of the present invention, the steps are the same as those in the comparative example, except that a CO gas is added for the first treatment following the LRM step. That is, the first treatment was carried out for 10 seconds under a pressure of 60 mTorr, using 100 sccm of CO and 260 sccm of $N_2$ instead of only 260 sccm of $N_2$ used in the comparative example, 400 watts of upper power, and a center/edge flow ratio of 50:50. There are no precipitates found on the surface of such obtained substrate, being normal without defects. As the right SEM photographs shown in FIGS. 8 and 9, no particles are present on the substrate 18 hours after the substrate is etched. The effect is clearly demonstrated through the CO treatment carried out in the process of the present invention. Very few defects were found through the scanning of the surface of the substrate by a KLA defect-scanning tool.

All combinations and sub-combinations of the above-described features also belong to the present invention. Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor manufacturing process, comprising:
   providing a substrate comprising a hard mask containing titanium and an underlying layer comprising a conductive layer beneath the hard mask;
   etching the hard mask and the underlying layer with a fluorine radical-containing plasma; and
   treating the substrate with a gas reactive to fluorine radicals in the form of a plasma to form a fluorine-containing compound after exposing the conductive layer in the underlying layer and removing the fluorine-containing compound, wherein the gas reactive to fluorine radicals is selected from the group consisting of CO, $CO_2$, a hydrocarbon compound, and HCN.

2. The semiconductor manufacturing process as claimed in claim 1, wherein the hard mask comprises TiN.

3. The semiconductor manufacturing process as claimed in claim 1, wherein the hard mask comprises Ti metal or a Ti compound.

4. The semiconductor manufacturing process as claimed in claim 1, wherein removing the fluorine-containing compounds is performed by vacuum pumping.

5. The semiconductor manufacturing process as claimed in claim 1, wherein removing the fluorine-containing compounds is performed by washing.

6. The semiconductor manufacturing process as claimed in claim 1, after treating the substrate with the gas reactive to fluorine radicals, further comprising:

purging the substrate with an inert gas, thereby removing residual gas reactive to fluorine radicals.

7. The semiconductor manufacturing process as claimed in claim 1, wherein the underlying layer comprises a first dielectric layer, the conductive layer formed in the first dielectric layer, a second dielectric layer formed on the first dielectric layer and the conductive layer; and the hard mask is disposed on the second dielectric layer.

8. The semiconductor manufacturing process as claimed in claim 7, wherein etching the hard mask and the underlying layer with the fluorine radical-containing plasma is to etch the hard mask and the second dielectric layer with the fluorine radical-containing plasma to expose a part of the conductive layer.

9. The semiconductor manufacturing process as claimed in claim 8, wherein the conductive layer comprises Cu.

10. The semiconductor manufacturing process as claimed in claim 1, after treating the substrate with a gas reactive to fluorine radicals, further comprising:

purging the substrate with an inert gas, thereby removing residual CO or $CO_2$.

11. The semiconductor manufacturing process as claimed in claim 10, wherein the inert gas comprises $H_2$ or $NH_3$.

12. The semiconductor manufacturing process as claimed in claim 7, wherein the substrate further comprises a cap layer covering the first dielectric layer and the conductive layer.

* * * * *